US010338120B2

(12) United States Patent
Chikando et al.

(10) Patent No.: US 10,338,120 B2
(45) Date of Patent: Jul. 2, 2019

(54) METHODS AND APPARATUS TO ANALYZE RADIO FREQUENCY EMISSIONS FROM DEVICES

(71) Applicant: Intel Corporation, Santa Clara, CA (US)

(72) Inventors: Eric Chikando, Gilbert, AZ (US); Neelima Velagapudi, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/667,612

(22) Filed: Aug. 2, 2017

(65) Prior Publication Data

US 2019/0041443 A1    Feb. 7, 2019

(51) Int. Cl.
| | | |
|---|---|---|
| *H04B 17/00* | (2015.01) |
| *G01R 29/08* | (2006.01) |
| *G01S 13/88* | (2006.01) |
| *G01S 5/02* | (2010.01) |
| *G01S 7/41* | (2006.01) |
| *G01V 3/12* | (2006.01) |
| *G01S 13/74* | (2006.01) |

(52) U.S. Cl.
CPC ..... *G01R 29/0892* (2013.01); *G01R 29/0814* (2013.01); *G01S 5/0284* (2013.01); *G01S 7/41* (2013.01); *G01S 13/88* (2013.01); *G01S 13/74* (2013.01); *G01V 3/12* (2013.01)

(58) Field of Classification Search
CPC ............ G01R 29/0892; G01R 29/0814; G01S 5/0284; G01S 7/41; G01S 13/88; G01S 13/74; G01V 3/12

USPC ............ 455/423, 67.11, 67.12, 67.14, 115.1, 455/115.2
See application file for complete search history.

(56) References Cited

U.S. PATENT DOCUMENTS

| | | | | |
|---|---|---|---|---|
| 6,404,829 B1 * | 6/2002 | Sonu | ................ | G11B 20/10009 |
| | | | | 375/341 |
| 7,119,739 B1 * | 10/2006 | Struckman | ............. | G01R 29/10 |
| | | | | 342/174 |
| 7,876,276 B1 * | 1/2011 | Zaman | ..................... | H01Q 3/08 |
| | | | | 343/703 |
| 9,360,549 B1 * | 6/2016 | Liu | ......................... | H01Q 3/267 |
| 9,726,704 B2 * | 8/2017 | Mannion | ................ | G01R 29/10 |
| 2008/0129615 A1 * | 6/2008 | Breit | .................... | G01R 29/105 |
| | | | | 343/703 |

(Continued)

OTHER PUBLICATIONS

Keysight Technologies, "N9038A MXE EMI Receiver, 3 Hz to 44 GHz," http://www.keysight.com/en/pdx-x201870-pn-N9038A/mxe-emi-receiver-3-hz-to-44-ghz?cc=US&lc=eng&pselect=SR.PM-Search%2OResults.Overview&pselect=SR.PM-Search%2520Results.Overview&cmpid=44269AMFWD, retrieved on Aug. 2, 2017, 2 pages.

(Continued)

*Primary Examiner* — Sonny Trinh
(74) *Attorney, Agent, or Firm* — Hanley, Flight & Zimmerman, LLC

(57) ABSTRACT

Methods, apparatus, systems and articles of manufacture to measure radio frequency emissions are disclosed. An example measurement device includes an antenna to collect a radio frequency emission signal, a calibrator to convert the received radio frequency emission signal to a far-field signal, a filter to remove a baseline signal from the radio frequency emission signal, and an interface to output the filtered radio emission signal.

20 Claims, 7 Drawing Sheets

(56) References Cited

U.S. PATENT DOCUMENTS

2013/0187674 A1* 7/2013 Rada .................... G01R 35/005
                                                                           324/750.02
2018/0034427 A1* 2/2018 Mostert ................ H03F 3/2173

OTHER PUBLICATIONS

ETS-LINDGREN, "7405 E & H Near Field Probe Set," retrieved on Aug. 2, 2017, http://www.ets-lindgren.com/7405, 2 pages.

* cited by examiner

METHODS AND APPARATUS TO ANALYZE RADIO FREQUENCY EMISSIONS FROM DEVICES

FIELD OF THE DISCLOSURE

This disclosure relates generally to analyzers, and, more particularly, to methods and apparatus to analyze radio frequency emissions from devices.

BACKGROUND

Electronic devices are often analyzed to determine an amount of radio frequency emissions radiated from the devices. For example, regulatory bodies often impose strict limits on the level of radio frequency (RF) emissions that may be radiated by devices to be approved for release into the marketplace. Typical approaches for evaluating the radio frequency devices involve the use of open areas test sites (OATS), semi-anechoic chambers (SAC), and/or gigahertz transverse electro-magnetic (G-TEM) cells.

The figures are not to scale. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 1:
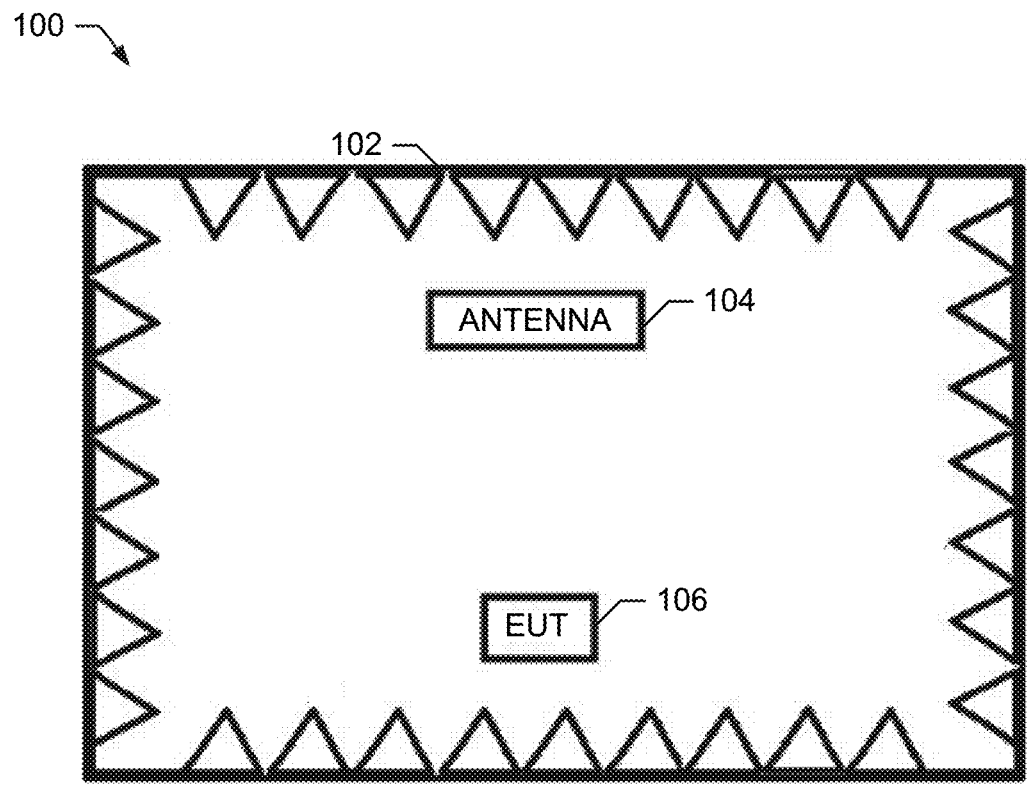
FIG. 1 is a block diagram of an example environment in which a semi-anechoic chamber contains an example antenna system analyzing RF emissions from an example equipment under test (EUT).

FIG. 1 is a block diagram of an example environment 100 in which a semi-anechoic chamber 102 contains an example antenna system 104 analyzing RF emissions from an example equipment under test (EUT) 106. The example semi-anechoic chamber 102 limits RF energy from devices outside the chamber 102 from entering the example chamber 102. In addition, the example semi-anechoic chamber 102 prevents RF emissions from the EUT 106 from reflecting off the walls of the chamber 102. Accordingly, the semi-anechoic chamber 102 provides an isolated environment in which RF emissions from the example EUT 106 may be tested.

While the example semi-anechoic chamber 102 and other specialized designed chambers and environments are good environments for measuring RF emissions from the EUT 106, the costs associated with building, maintaining, and/or renting access to such environments is high. Such costs are compounded due to development processes in which several iterations of testing and reworking of a product may be needed to identify a product design that does not exceed desired and/or regulatory limits. Example regulatory rules include International Special Committee on Radio Interference (CISPR)-32 Class A, CISPR-32 Class B, etc.

Methods and apparatus disclosed herein facilitate measurement of RF emissions from a device even when a specialized chamber is not utilized. In some example implementations, external noise is identified and adaptively cancelled to prevent interference with the measurement of a EUT. In some example implementations, measurements are adjusted from near-field to far-field measurements while accounting for phase components to replicate measurement in a chamber. In some example implementations, a device for such measurements may be implemented as a portable device to facilitate ease of use (e.g., bringing the portable measurement device to the EUT instead of bringing the EUT to a chamber).

Figure 2:
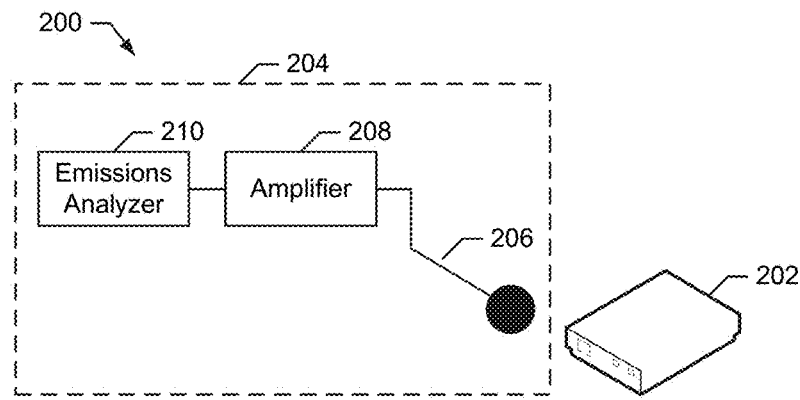
FIG. 2 is a block diagram of an example environment in which RF emissions of an example EUT are measured by an example measurement device.

FIG. 2 is a block diagram of an example environment 200 in which RF emissions of an example EUT 202 are measured by an example measurement device 204. According to the illustrated example, the environment 200 does not include a specialized and/or isolated chamber in which measurements must be performed. Accordingly, the example environment 200 may be a test bench, a location at which the EUT 202 operates while in use, etc. The example environment 200 does not include a semi-anechoic chamber or other RF containment equipment. Alternatively, the measurement device 204 may be operated in a semi-anechoic chamber or other enclosure.

The example EUT 202 is a device that emits RF emissions. For example, the EUT 202 may be any type of electronic device such as a computing device, a wireless communication device, an audio presentation device, a video presentation device, etc. The RF emissions from the example EUT 202 may be output by design (e.g., in a wireless communication device that communicates through the use of RF signals) or a byproduct of operation of the EUT 202 (e.g., a video presentation device that emits RF signals through operation that does not include wireless communication).

The example measurement device 204 includes an example antenna 206, an example amplifier 208, and an example emissions analyzer 210. According to the illustrated example, the antenna 206, the amplifier 208, and the emissions analyzer 210 are integrated into a single device (e.g., contained within a case, housing, etc.). Alternatively, one of more of the antenna 206, the amplifier 208, and the emissions analyzer 210 may be separate devices that are coupled via wires and/or wirelessly. In some examples, the measurement device 204 may include a battery power source to provide for increased portability of the measurement device 204. Alternatively, any other source of power may be utilized.

According to the illustrated example, during operation, the antenna 206 is positioned near the example EUT 202 so that it is irradiated with any RF emissions from the example EUT 202, which are then amplified by the example amplifier 208 and fed to the example emissions analyzer 210. The example emissions analyzer 210 processes the amplified RF emissions to perform filtering and adjustment of the signal from near-field to far-field to replicate the signal that would be experienced by the antenna system 104 in the example semi-anechoic chamber 102.

The example antenna 206 is a unidirectional near-field probe antenna structured to collect RF signals from a single direction (e.g., a direction facing towards the EUT 202). Alternatively, any other type of antenna may be utilized (e.g., a bi-directional antenna, an omni-directional antenna, a far-field antenna, etc.). As used herein, the near-field is a region less than 10 meters away from the EUT 202). Alternatively, the antenna 206 may be utilized at another distance (e.g., less than an RF emissions wavelength length divided by 2 pi meters, etc.).

The example amplifier 208 is a signal amplifier to amplify the RF emissions captured by the example antenna 206. According to the illustrated example, the amplifier 208 is implemented as circuitry coupled to the example antenna 206 (e.g., via a connector). Alternatively, the amplifier 208 may be integrated with the example antenna 206, may be integrated with the emissions analyzer 210, and/or, if amplification is not needed, may be excluded from the measurement device 204. The RF emissions amplified by the example amplifier 208 are provided to the example emissions analyzer 210 for analysis.

The example emissions analyzer 210 analyzes the example RF emissions captured by the antenna 206 and amplified by the example amplifier 208. The emissions analyzer 210 of FIG. 2 processes the RF emissions to remove unwanted signals (e.g., external noise) and convert the collected RF emissions from near-field to far-field to simulate the collection of data at a distance in a collection environment such as a semi-anechoic chamber. The processed RF emissions data from the example emissions analyzer 210 is output for review (e.g., is presented in a display, transmitted to a network location, etc.). The emissions analyzer 210 is described in further detail in conjunction with FIG. 3.

According to the illustrated example, the measurement device 204 is implemented as an integrated device contained in a single housing. In the illustrated example, the emissions analyzer 210 is implemented by a field programmable gate array (FPGA) implemented within the housing. In some examples, the measurement device 204 may include a battery contained in the same housing. Alternatively, measurement device 204 may receive external power (e.g., from an external power supply, from an external battery, etc.). In some examples, the emissions analyzer 210

Figure 3:
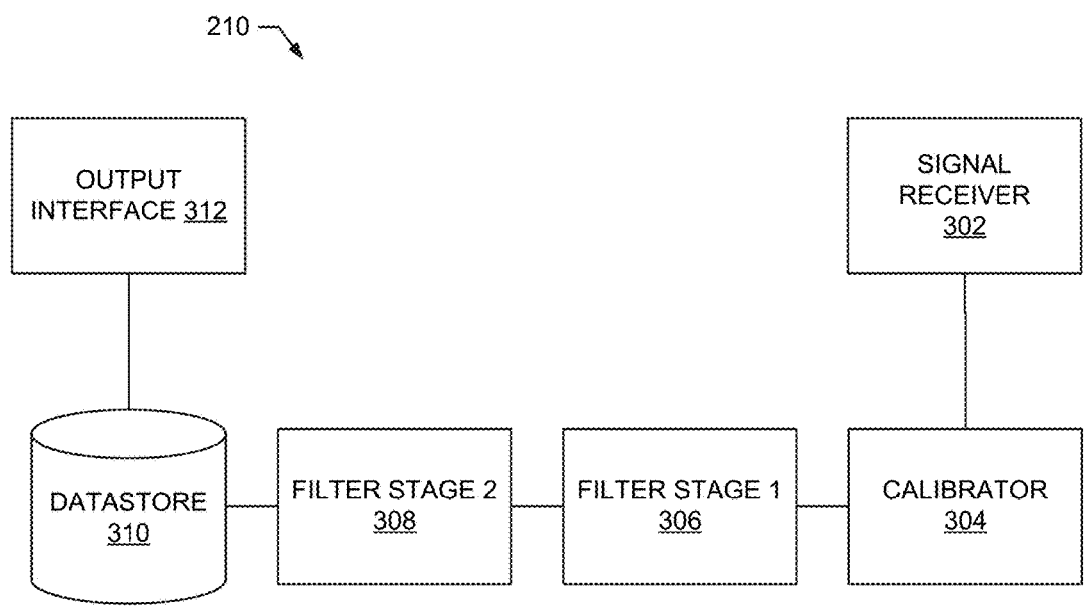
FIG. 3 is a block diagram of an example implementation of the measurement device of FIG. 2.

FIG. 3 is a block diagram of an example implementation of the measurement device 204 of FIG. 2. The example measurement device 204 of FIG. 2 includes an example signal receiver 302, an example calibrator 304, an example first filter stage 306, an example second filter stage 308, an example datastore 310, and an example network interface 312.

The example signal receiver 302 receives signals collected by the example antenna 206 and amplified by the example amplifier 208. According to the illustrated example, the signal receiver 302 is implemented as an interface connected to the amplifier 208. In some examples, the signal receiver 302 may additionally include an interface to communicate with the EUT 202. For example, the signal receiver 302 may communicate with the EUT 202 to control operation of the EUT 202 (e.g., to power on/enable the EUT 202, to power off/disable the EUT 202, etc.). According to the illustrated example, the signal receiver 302 receives RF emissions signals during times when the EUT 202 is operating (e.g., powered on, enabled, etc.) and times when the EUT 202 is not operating. For example, the RF emissions signals collected when the EUT 202 are utilized to determine a baseline level of RF emissions (e.g., RF emissions in the environment generated by devices and/or conditions other than the EUT 202) and the RF emissions signals collected when the EUT 202 is operating are utilized to determine RF emissions caused by the EUT 202 (e.g., after removing the effects of the baseline).

The calibrator 304 of the illustrated example adjusts the signal received from the signal receiver 302 to compensate for the amplification of the example amplifier 208, to compensate for losses due to cables and connectors of the measurement device 204, and to adjust from near-field to far-field. To compensate for the amplification (e.g., to determine the unamplified signal), the example calibrator 304 subtracts a gain profile of the example amplifier 208 across a relevant frequency range (e.g., 30 MHz to 1000 MHz) from the received signal. To compensate for losses due to cables and connectors, the example calibrator 304 adds a loss correction factor to the received signal. For example, the loss correction factor may be determined by analyzing the cables and connectors to determine the loss due to the cables and connectors within the relevant frequency range. To adjust the received signal from near-field to far-field, the example calibrator 304 adds a field correction factor. According to the illustrated example, the field correction factor is computed as 20 log $$\left(5*10^{-5}*W*L-\frac{\pi}{4}\right),$$

where W is the width of the semi-anechoic chamber (e.g., the semi-anechoic chamber 102 of FIG. 1) to be simulated, and L is the length of the semi-anechoic chamber to be simulated. Alternatively, any types of correction factors and/or correction factor computations may be utilized.

The example first filter stage 306 and second filter stage 308 are RF signal filters that filter the RF signal from the example calibrator 304 to remove the baseline or external (not caused by the EUT 202) signals from the RF signal from the example calibrator 304. According to the illustrated example, the first filter 306 and the second filter 308 are implemented by a particularly programmed FPGA. Alternatively, the first filter 306 and/or the second filter 308 may be implemented by any other type of filter (e.g., a digital signal processor, circuitry, etc.).

According to the illustrated example, the first filter stage 306 filters in a first frequency range and the second filter stage 308 filters in a second frequency range that does not overlap with the first frequency range. For example, the first filter stage 306 filters in the frequency range of 30-230 MHz and the second filter stage 308 filters in the frequency range of 231-1000 MHz. In other implementations, other frequency ranges may be utilized. For example, the frequency range(s) may be selected based on the frequency ranges of interest (e.g., when analyzing RF emissions for regulatory compliance, the frequency range(s) may be selected based on the frequency range(s) relevant to the regulatory rules).

In some implementations, more or fewer filter stages may be utilized. For example, more filter stages processing narrower frequency ranges may be utilized.

After filtering the RF emissions signal, the filtered signal is stored in the example datastore 310. The example datastore 310 is a memory such as a flash memory. Alternatively, the datastore 310 may be any type of storage such as a hard drive, a solid state storage, a database, a buffer, a cache, a file, etc.

The example output interface 312 outputs the results of the RF emissions analysis. According to the illustrated example, the output interface 312 compares the results to a threshold and outputs an indication as to whether the RF emissions meet or exceed the threshold. For example, the output interface 312 may have a setting for a threshold (e.g., a threshold level of RF emissions identified by a regulatory standard) and may compare the RF emissions collected by the measurement device 204 to the threshold to determine if the RF emissions meet or exceed the threshold (e.g., violate the regulatory standard). The threshold may be a set value and/or may be a threshold that varies (e.g., varies based on frequency). For example, because ambient noise is present on both the signal envelope of the baseline signal and the signal collected during operation of EUT 202, a threshold T that varies for block m may be computed from the mean and standard deviation of a signal x as:

$$T_m \cong \frac{x_m - \mu_m}{\sigma_m}, \hat{x}(i) = \sum_{n=1}^{m} S_n \cdot e^{i(\alpha_n + j\omega_n)}, \omega_n = 2\pi f_n, \omega_n$$

is the angular frequency of a given signal component, $S_n$ is the magnitude of the signal component. Alternatively, any other fixed or varying threshold may be utilized in other implementations.

The output interface 312 may additionally or alternatively be a network interface to communicate the RF emissions analysis results to a remote location via a network. For example, the output interface 312 may be connected with a cloud service to enable access to the information collected and/or generated by the example measurement device 204.

While an example manner of implementing the measurement device 204 of FIG. 2 is illustrated in FIG. 3, one or more of the elements, processes and/or devices illustrated in FIG. 3 may be combined, divided, re-arranged, omitted, eliminated and/or implemented in any other way. Further, the example signal receiver 302, the example calibrator 304, the example first filter stage 306, the example second filter stage 308, the example datastore 310, the example network interface 312 and/or, more generally, the example measurement device 204 of FIG. 2 may be implemented by hardware, software, firmware and/or any combination of hardware, software and/or firmware. Thus, for example, any of the example signal receiver 302, the example calibrator 304, the example first filter stage 306, the example second filter stage 308, the example datastore 310, the example network interface 312 and/or, more generally, the example measurement device 204 of FIG. 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, signal receiver 302, the example calibrator 304, the example first filter stage 306, the example second filter stage 308, the example datastore 310, and/or the example network interface 312 is/are hereby expressly defined to include a non-transitory computer readable storage device or storage disk such as a memory, a digital versatile disk (DVD), a compact disk (CD), a Blu-ray disk, etc. including the software and/or firmware. Further still, the example measurement device 204 of FIG. 2 may include one or more elements, processes and/or devices in addition to, or instead of, those illustrated in FIG. 3, and/or may include more than one of any or all of the illustrated elements, processes and devices.

Flowcharts representative of example machine readable instructions for implementing the measurement device 204 of FIG. 2 are shown in FIGS. 4-8. In the examples, the machine readable instructions comprise a program for execution by a processor such as the processor 912 shown in the example processor platform 900 discussed below in connection with FIG. 9. The program may be embodied in software stored on a non-transitory computer readable storage medium such as a CD-ROM, a floppy disk, a hard drive, a digital versatile disk (DVD), a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 4, many other methods of implementing the example measurement device 204 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 4-9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

Figure 4:
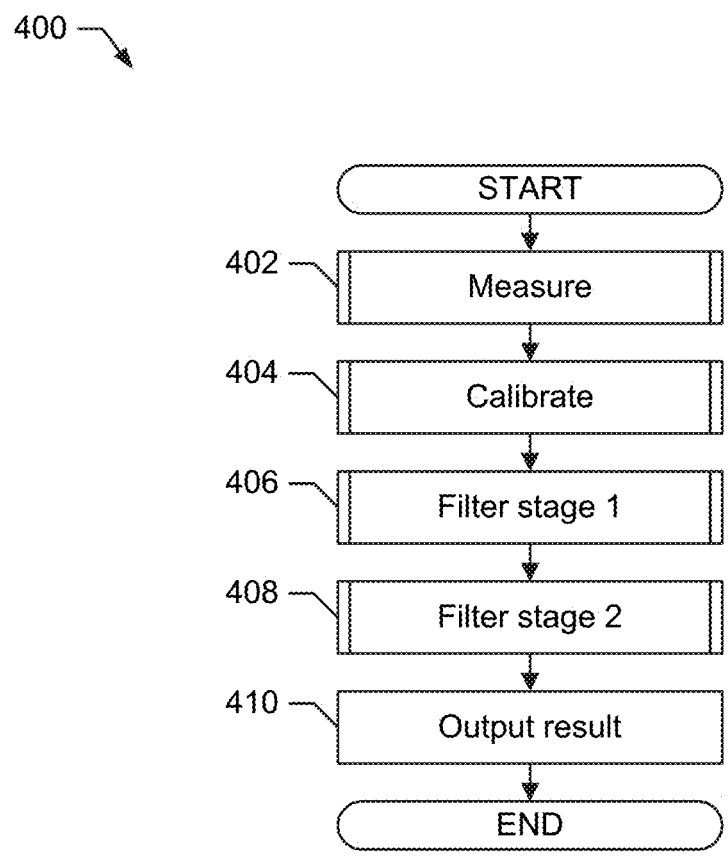
FIGS. 4-8 are flowcharts illustrating example machine readable instructions that may be executed to implement the measurement device of FIG. 2 and/or FIG. 3.

The flowchart of FIG. 4 illustrates an example process that may be implemented by machine readable instructions. Example implementations of blocks of the flowchart of FIG. 4 are described in conjunction with FIGS. 5-8.

The program 400 of FIG. 4 begins at block 402 when the example signal receiver 302 measures the RF emissions in the example environment 200. According to the illustrated example, the signal receiver 302 receives a baseline measurement while the EUT 202 is not activated/not powered on/not enabled and receives an emissions measurement while the EUT 202 is activated/powered on/enabled.

The example calibrator 304 then calibrates the emissions data based on the baseline data and any other calibration parameters (block 404). According to the illustrated example, the calibrator 304 adjusts the emissions signal to compensate for the amplification of the example amplifier 208, to compensate for losses due to cables and connectors of the measurement device 204, and to adjust from near-field to far-field. For example, the characteristics of the amplifier 208, loses due to cables and connectors, and near-field to far-field adjustment parameters may be predetermined and/ or adjustable by an operator of the example measurement device 204.

The emissions signal from the calibrator 304 is then filtered by the first filter stage 306 (block 406). The filtered signal from the first filter stage 306 is then filtered by the second filter stage 308 (block 408). According to the illustrated example, the first filter stage 306 filters to remove the effects of the baseline signal within the frequency range 30-230 MHz and the example second filter stage 308 filters to remove the effects of the baseline signal within the frequency range 231-1000 MHz. According to the illustrated example, the result of the filtering is stored in the example datastore 310.

The example network interface 312 then outputs the result of the filtering (block 410). For example, the results of the filtering may be transmitted to a cloud storage location for access by an operator. Alternatively, the results of the filtering may be output in any other manner (e.g., output on a display of the example measurement device 204).

Figure 5:
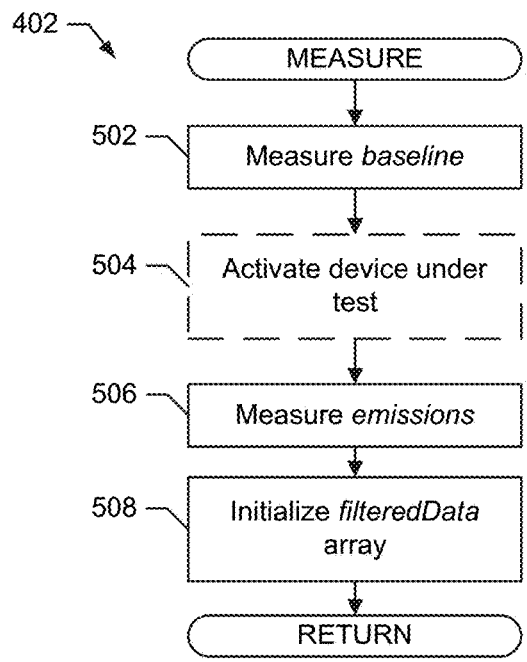

FIG. 5 is a flowchart of an example implementation of block 402 of FIG. 4 for measuring signals by the example measurement device 204. The example process 500 begins when the example signal receiver 302 measures the baseline signal (block 502). For example, the baseline signal may be measured before the EUT 202 is activated. The example EUT 202 is then activated (block 504). According to the illustrated example, the EUT 202 is activated by an operator of the example measurement device 204. For example, the operator may connect power to the EUT 202, may activate a control to enable the EUT 202, etc. Alternatively, the signal receiver 302 may be coupled to the example EUT 202 to activate the EUT 202.

After the EUT 202 is activated, the example signal receiver 302 measures the emissions signal (block 506). For example, the emissions signal is collected by the antenna 206, amplified by the example amplifier 208, and received by the example signal receiver 302.

According to the illustrated example, after measuring the baseline signal (block 502) and measuring the emissions signal (block 506), the example signal receiver 302 initializes a filtered-data array in which the results of the filtering stages will be stored (block 508). Alternatively, the filtered-data array may be initialized by another component (e.g., the first filter stage 306).

Figure 6:
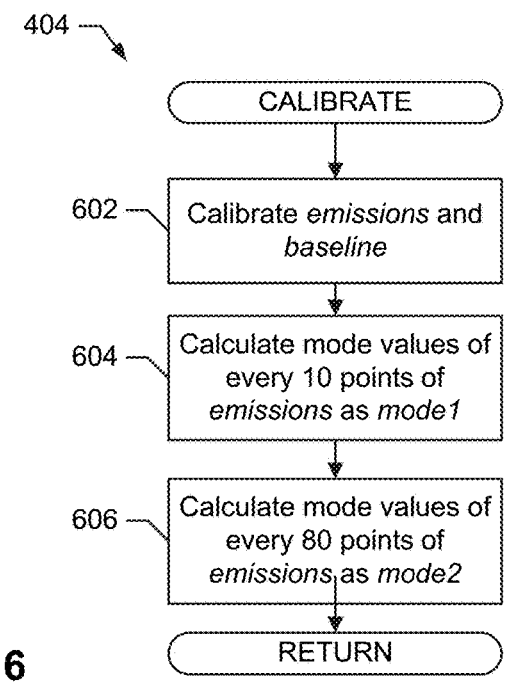

FIG. 6 is a flowchart of an example process to implement block 404 of FIG. 4 for calibrating the emissions signal. The example process 600 begins at block 602 when the calibrator 304 calibrates the emissions and the baseline signals. For example, the calibrator 304 may convert the signals from near-field to far-field, adjust the signals for losses (e.g., cables and connectors losses), compensate for amplification by the example amplifier 208, etc. The example calibrator 304 calculates mode values of every 10 data points of the emissions data (e.g., the result is stored as the mode1) (block 604). The example calibrator 304 then calculates mode values of every 80 points of the emissions data (mode2) (block 606).

Figure 7:
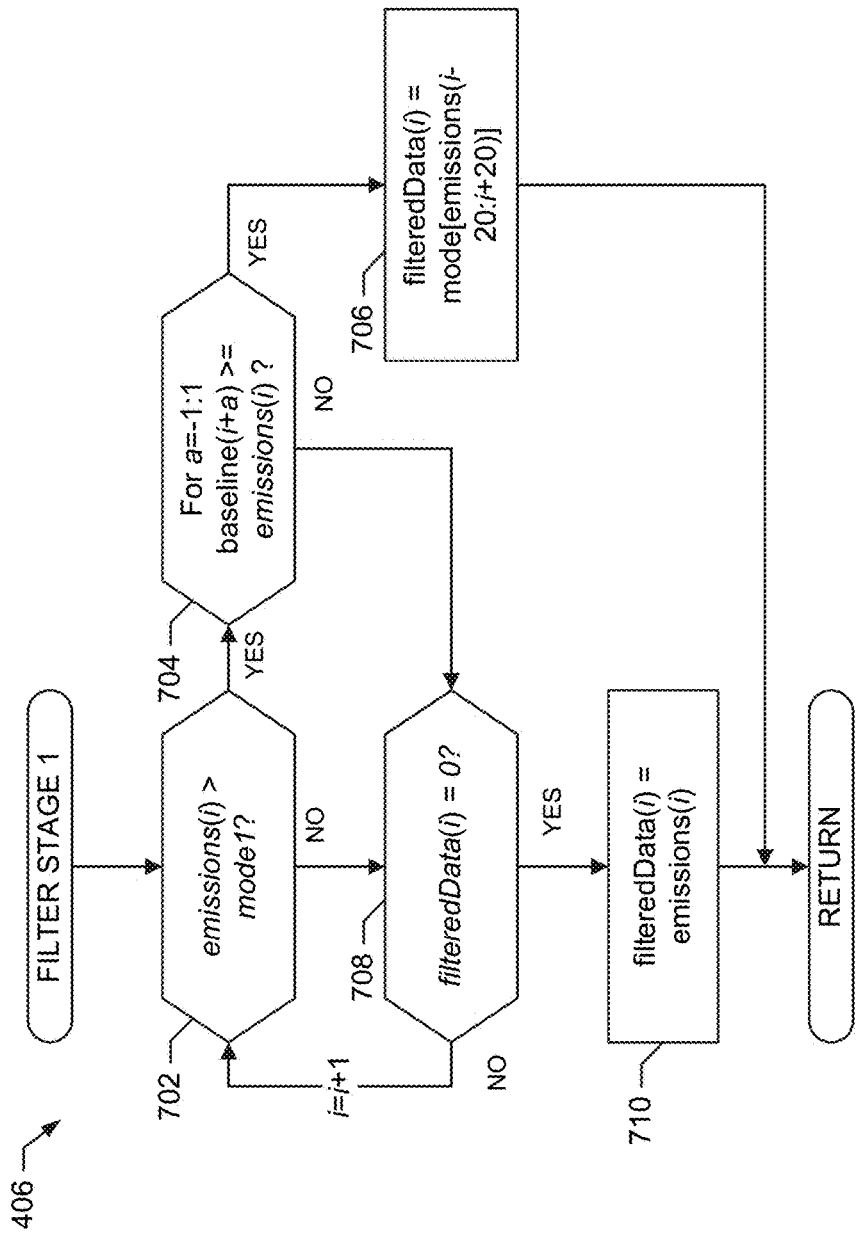

FIG. 7 is a flowchart of an example process to implement block 406 of FIG. 4 for implementing the first filter stage 306. The example process 700 of FIG. 7 is iterates over the elements i of the emissions and baseline data. The example process 700 begins at block 702 when the example first filter stage 306 determines if the emissions element i is greater than the mode1 value. When the emissions element i is not greater than mode1, control proceeds to block 708. When the emissions element i is greater than mode1, the example first filter stage 306 determines if the baseline (i+a) for a between −1 and 1 is greater than or equal to emissions element i (block 704). When the baseline (i+a) for a between −1 and 1 is not greater than or equal to emissions element i, control proceeds to block 708. When the baseline (i+a) for a between −1 and 1 is greater than or equal to emissions element i, the example first filter stage 306 determines filtered-data element i as the mode of emissions(i−20:i+20). The filtered-data element is stored and the process 700 is complete.

Turning to block 708, the example first filter stage 306 determines if filtered-data element i is zero (e.g., has been initialized but not yet populated) (block 708). When the filtered-data element i is zero, i is incremented (e.g., i=i+1) and control returns to block 702. When the filtered-data element i is not zero, filtered-data element i is set to emissions element i (block 710) and the process 700 is complete.

Accordingly, the process 700 of FIG. 7 for implementing the first filter stage 306 provides filtering to remove the contribution of the baseline (e.g., RF emissions due to sources other than the EUT 202) within a first frequency range (e.g., 130-230 MHz according to the illustrated example).

Figure 8:
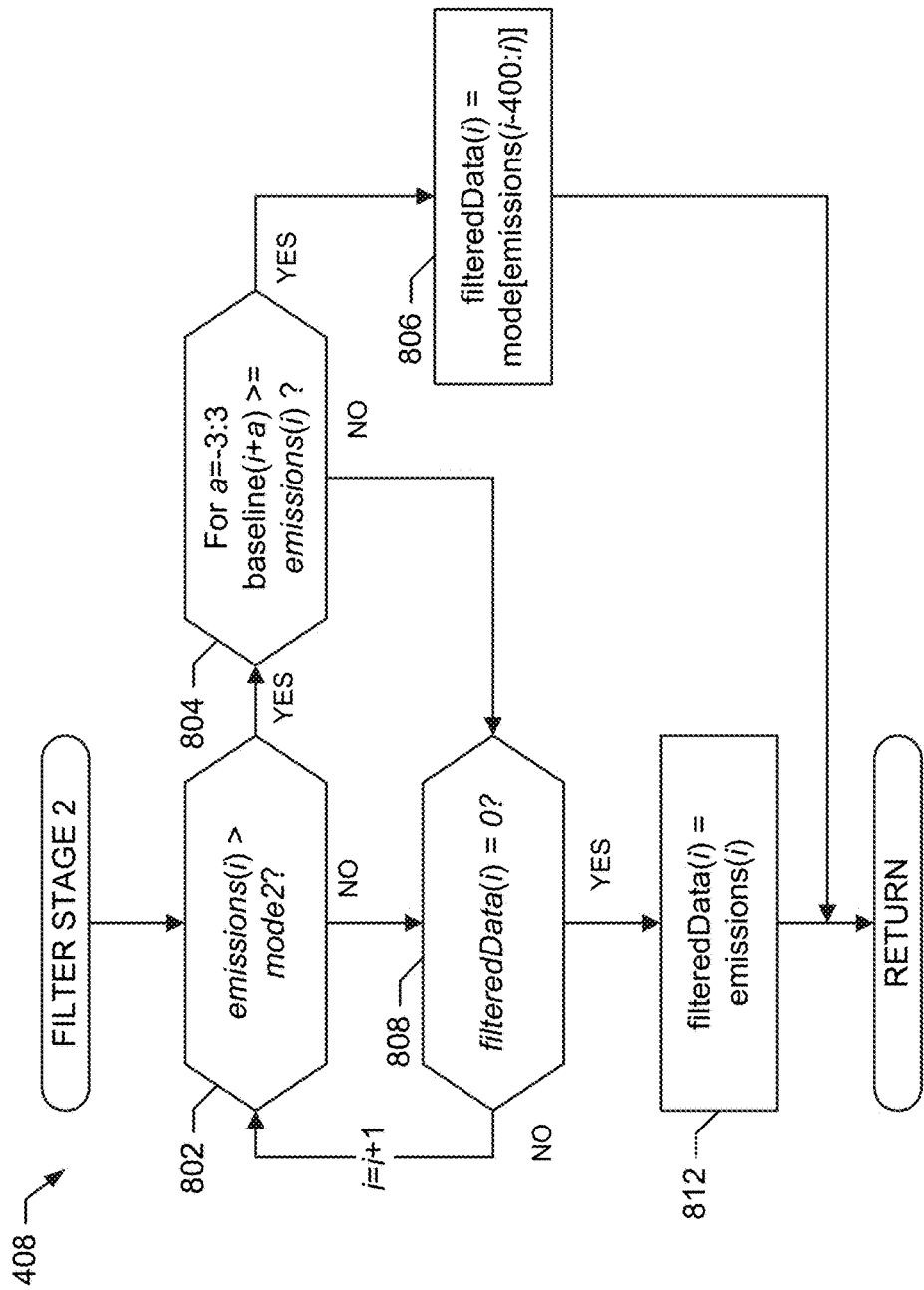

FIG. 8 is a flowchart of an example process to implement block 408 of FIG. 4 for implementing the second filter stage 308. The example process 800 of FIG. 8 is iterates over the elements i of the emissions and baseline data. The example process 800 begins at block 802 when the example second filter stage 308 determines if the emissions element i is greater than the mode2 value. When the emissions element i is not greater than mode2, control proceeds to block 808. When the emissions element i is greater than mode2, the example second filter stage 308 determines if the baseline (i+a) for a between −3 and 3 is greater than or equal to emissions element i (block 804). When the baseline (i+a) for a between −3 and 3 is not greater than or equal to emissions element i, control proceeds to block 808. When the baseline (i+a) for a between −3 and 3 is greater than or equal to emissions element i, the example second filter stage 308 determines filtered-data element i as the mode of emissions (i−400:i). The filtered-data element is stored and the process 800 is complete.

Turning to block 808, the example second filter stage 308 determines if filtered-data element i is zero (e.g., has been initialized but not yet populated) (block 808). When the filtered-data element i is zero, i is incremented (e.g., i=i+1) and control returns to block 802. When the filtered-data element i is not zero, filtered-data element i is set to emissions element i (block 810) and the process 800 is complete.

Accordingly, the process 800 of FIG. 8 for implementing the second filter stage 308 provides filtering to remove the contribution of the baseline (e.g., RF emissions due to sources other than the EUT 202) within a first frequency range (e.g., 231-1000 MHz according to the illustrated example).

Figure 9:
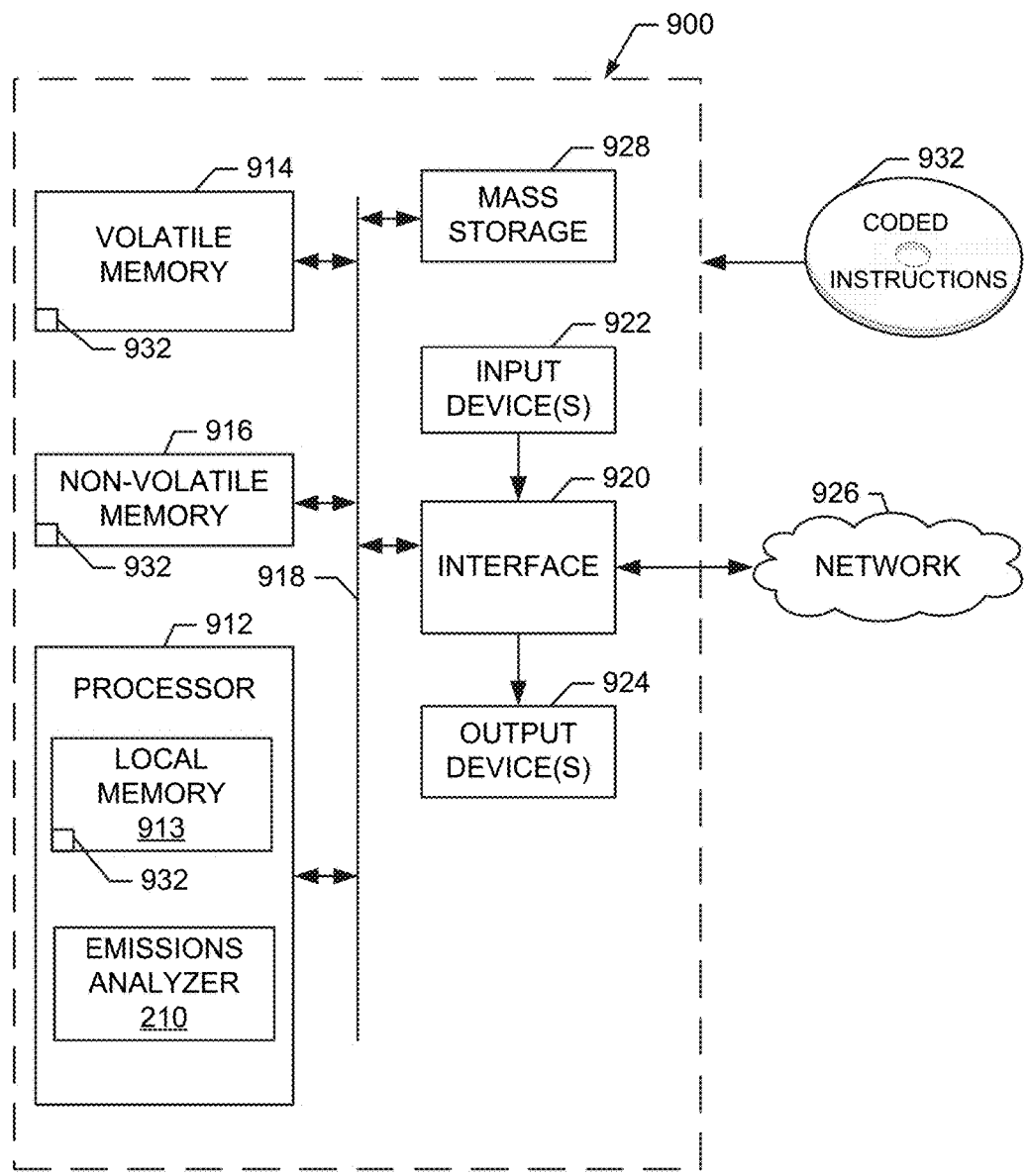
FIG. 9 is a block diagram of an example processing system that may execute the machine readable instructions of FIGS. 4-8 to implement the example measurement device of FIG. 2 and/or FIG. 3.

FIG. 9 is a block diagram of an example processor platform 900 capable of executing the instructions of FIGS. 4-8 to implement the measurement device 204 of FIGS. 2 and/or 3. The processor platform 900 can be, for example, a server, a personal computer, a mobile device (e.g., a cell phone, a smart phone, a tablet such as an iPad™), a personal digital assistant (PDA), an Internet appliance or any other type of computing device.

The processor platform 900 of the illustrated example includes a processor 912. The processor 912 of the illustrated example is hardware. For example, the processor 912 can be implemented by one or more integrated circuits, logic circuits, microprocessors or controllers from any desired family or manufacturer. The hardware processor may be a semiconductor based (e.g., silicon based) device. In this example, the processor implements the measurement device 204.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

The coded instructions 932 of FIGS. 4-8 may be stored in the mass storage device 928, in the volatile memory 914, in the non-volatile memory 916, and/or on a removable tangible computer readable storage medium such as a CD or DVD.

From the foregoing, it will be appreciated that example methods, apparatus and articles of manufacture have been disclosed that provide a measurement device that may be utilized for analyzing RF emissions from a device without (or with) a specialized RF controlled environment (e.g., a semi-anechoic chamber). In some examples, the measurement device may be an integrated device that includes an analyzer integrated with an antenna/probe in a portable device that may be carried to the location of the equipment to be tested. In some examples, the costs of analyzing RF emissions (e.g., to test for compliance with regulatory standards such as during development in which multiple product iterations will be developed) are reduced by the methods and apparatus disclosed herein because the cost of renting or building specialized RF containment environments may be avoided.

Example methods, apparatus, systems and articles of manufacture to detect anomalies in electronic data are disclosed herein. Further examples and combinations thereof include the following.

Example 1 is a measurement device to measure radio frequency emissions, the measurement device comprising: an antenna to collect a radio frequency emission signal, a calibrator to convert the radio frequency emission signal to a far-field signal, a filter to remove a baseline signal from the radio frequency emission signal, and an interface to output the filtered radio emission signal.

Example 2 includes the measurement device as defined in example 1, further including an amplifier to amplify the radio frequency emission signal.

Example 3 includes the measurement device as defined in example 2, wherein the calibrator is to adjust the amplified radio frequency emissions signal to reverse an effect of the amplifier.

Example 4 includes the measurement device as defined in one of the foregoing examples, wherein the filter includes a first filter stage associated with a first frequency range and a second filter stage associated with a second frequency range.

Example 5 includes the measurement device as defined in one of the foregoing examples, wherein the calibrator is to adjust the radio frequency emission signal to compensate for signal losses due to at least one of cables and connections of the measurement device.

Example 6 includes the measurement device as defined in one of the foregoing examples, wherein the interface is a network interface to transmit the filtered radio emission signal to a remote server via a network.

Example 7 includes the measurement device as defined in one of the foregoing examples, wherein the filter is integrated into a case containing the antenna.

Example 8 is a method to measure radio frequency emissions, the method comprising: collecting a radio frequency emission signal with an antenna, converting the radio frequency emission signal to a far-field signal, removing a baseline signal from the radio frequency emission signal, and outputting the filtered radio emission signal.

Example 9 includes the method as defined in example 8, further including amplifying the radio frequency emission signal with an amplifier.

Example 10 includes the method as defined in example 9, further including adjusting the amplified radio frequency emissions signal to reverse an effect of the amplifier.

Example 11 includes the method as defined in one of examples 8-10, wherein removing the baseline signal includes filtering the radio frequency emission signal with a first filter stage associated with a first frequency range and filtering the radio frequency emissions signal with a second filter stage associated with a second frequency range.

Example 12 includes the method as defined in one of examples 8-11, further including adjusting the radio frequency emission signal to compensate for signal losses due to at least one of cables and connections of a measurement device.

Example 13 includes the method as defined in one of examples 8-12, further including transmitting the filtered radio emission signal to a remote server via a network.

Example 14 is a non-transitory computer readable storage medium comprising instructions that, when executed, cause a machine to at least: collect a radio frequency emission signal with an antenna, convert the radio frequency emission signal to a far-field signal, remove a baseline signal from the radio frequency emission signal, and output the filtered radio emission signal.

Example 15 includes the non-transitory computer readable storage medium as defined in example 14, wherein the instructions, when executed, cause the machine to amplify the radio frequency emission signal with an amplifier.

Example 16 includes the non-transitory computer readable storage medium as defined in example 15, wherein the instructions, when executed, cause the machine to adjust the amplified radio frequency emissions signal to reverse an effect of the amplifier.

Example 17 includes the non-transitory computer readable storage medium as defined in one of examples 14-16, wherein the instructions, when executed, cause the machine to remove the baseline signal by filtering the radio frequency emission signal with a first filter stage associated with a first frequency range and filtering the radio frequency emissions signal with a second filter stage associated with a second frequency range.

Example 18 includes the non-transitory computer readable storage medium as defined in one of examples 14-17, wherein the instructions, when executed, cause the machine to adjust the radio frequency emission signal to compensate for signal losses due to at least one of cables and connections of the machine.

Example 19 includes the non-transitory computer readable storage medium as defined in one of examples 14-18, wherein the instructions, when executed, cause the machine to transmit the filtered radio emission signal to a remote server via a network.

Example 20 includes the non-transitory computer readable storage medium as defined in one of examples 14-19, wherein the machine is integrated into a case containing the antenna.

Example 21 is a measurement device to measure radio frequency emissions, the measurement device comprising: first means for collecting a radio frequency emission signal with an antenna, second means for converting the radio frequency emission signal to a far-field signal, third means for removing a baseline signal from the radio frequency emission signal, and fourth means for outputting the filtered radio emission signal.

Example 22 includes the measurement device as defined in example 21, further including fifth means for amplifying the radio frequency emission signal with an amplifier.

Example 23 includes the measurement device as defined in example 22, wherein the seconds means are to adjust the amplified radio frequency emissions signal to reverse an effect of the amplifier.

Example 24 includes the measurement device as defined in one of examples 21-23, wherein the third means are to remove the baseline signal by filtering the radio frequency emission signal with a first filter stage associated with a first frequency range and filtering the radio frequency emissions signal with a second filter stage associated with a second frequency range.

Example 25 includes the measurement device as defined in one of examples 21-24, wherein the second means are to adjust the radio frequency emission signal to compensate for signal losses due to at least one of cables and connections of a measurement device.

Example 26 includes the measurement device as defined in one of examples 21-25, wherein the fourth means are to transmit the filtered radio emission signal to a remote server via a network.

Example 27 is a system to measure radio frequency emissions, the system comprising: an antenna to collect a radio frequency emission signal, a measurement device including: a calibrator to convert the radio frequency emission signal to a far-field signal, a filter to remove a baseline signal from the radio frequency emission signal, and an interface to output the filtered radio emission signal.

Example 28 includes the system as defined in example 27, further including an amplifier to amplify the radio frequency emission signal.

Example 29 includes the system as defined in example 28, wherein the calibrator is to adjust the amplified radio frequency emissions signal to reverse an effect of the amplifier.

Example 30 includes the system as defined in one of examples 27-29, wherein the filter includes a first filter stage associated with a first frequency range and a second filter stage associated with a second frequency range.

Example 31 includes the system as defined in one of examples 27-30, wherein the calibrator is to adjust the radio frequency emission signal to compensate for signal losses due to at least one of cables and connections of the measurement device.

Example 32 includes the system as defined in one of examples 27-31, wherein the interface is a network interface to transmit the filtered radio emission signal to a remote server via a network.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A measurement device to measure radio frequency emissions, the measurement device comprising:
   an antenna to collect a radio frequency emission signal;
   an amplifier to amplify the radio frequency emission signal;
   a calibrator to adjust the amplified radio frequency emissions signal to reverse an effect of the amplifier, and convert the radio frequency emission signal to a far-field signal;
   a filter to remove a baseline signal from the radio frequency emission signal; and
   an interface to output the filtered radio emission signal.

2. The measurement device as defined in claim 1, wherein the filter includes a first filter stage associated with a first frequency range and a second filter stage associated with a second frequency range.

3. The measurement device as defined in claim 1, wherein the calibrator is to adjust the radio frequency emission signal to compensate for signal losses due to at least one of a cable, or a connection of the measurement device.

4. The measurement device as defined in claim 1, wherein the interface is a network interface to transmit the filtered radio emission signal to a remote server via a network.

5. The measurement device as defined in claim 1, wherein the filter is integrated into a case containing the antenna.

6. The measurement device as defined in claim 1, wherein the effect of the amplifier includes a gain profile of the amplifier.

7. The measurement device as defined in claim 1, wherein the calibrator is to convert the radio frequency emission signal to the far-field signal by applying a field correction factor to the radio frequency emission signal, the field correction factor based on a dimension of a simulated semi-anechoic chamber.

8. The method as defined in claim 1, wherein the converting the radio frequency emission signal to the far-field signal includes applying a field correction factor to the radio frequency emission signal, the field correction factor based on a dimension of a simulated semi-anechoic chamber.

9. A method to measure radio frequency emissions, the method comprising:
collecting a radio frequency emission signal with an antenna;
amplifying the radio frequency emission signal with an amplifier;
adjusting the amplified radio frequency emissions signal to reverse an effect of the amplifier;
converting the radio frequency emission signal to a far-field signal;
removing a baseline signal from the radio frequency emission signal; and
outputting the filtered radio emission signal.

10. The method as defined in claim 9, wherein removing the baseline signal includes filtering the radio frequency emission signal with a first filter stage associated with a first frequency range and filtering the radio frequency emissions signal with a second filter stage associated with a second frequency range.

11. The method as defined in claim 9, further including adjusting the radio frequency emission signal to compensate for signal losses due to at least one of a cable, or a connection of a measurement device.

12. The method as defined in claim 9, further including transmitting the filtered radio emission signal to a remote server via a network.

13. The method as defined in claim 9, wherein the effect of the amplifier includes a gain profile of the amplifier.

14. A non-transitory computer readable storage medium comprising instructions that, when executed, cause a machine to at least:
collect a radio frequency emission signal with an antenna;
amplify the radio frequency emission signal with an amplifier;
adjust the amplified radio frequency emissions signal to reverse an effect of the amplifier;
convert the radio frequency emission signal to a far-field signal;
remove a baseline signal from the radio frequency emission signal; and
output the filtered radio emission signal.

15. The non-transitory computer readable storage medium as defined in claim 14, wherein the instructions, when executed, cause the machine to remove the baseline signal by filtering the radio frequency emission signal with a first filter stage associated with a first frequency range, and filtering the radio frequency emissions signal with a second filter stage associated with a second frequency range.

16. The non-transitory computer readable storage medium as defined in claim 14, wherein the instructions, when executed, cause the machine to adjust the radio frequency emission signal to compensate for signal losses due to at least one of a cable, or a connection of the machine.

17. The non-transitory computer readable storage medium as defined in claim 14, wherein the instructions, when executed, cause the machine to transmit the filtered radio emission signal to a remote server via a network.

18. The non-transitory computer readable storage medium as defined in claim 14, wherein the machine is integrated into a case containing the antenna.

19. The non-transitory computer readable storage medium as defined in claim 14, wherein the effect of the amplifier includes a gain profile of the amplifier.

20. The non-transitory computer readable storage medium as defined in claim 14, wherein the converting the radio frequency emission signal to the far-field signal includes applying a field correction factor to the radio frequency emission signal, the field correction factor based on a dimension of a simulated semi-anechoic chamber.

* * * * *